United States Patent
Liang et al.

(10) Patent No.: US 11,605,652 B2
(45) Date of Patent: Mar. 14, 2023

(54) ARRAY SUBSTRATE

(71) Applicant: Au Optronics Corporation, Hsinchu (TW)

(72) Inventors: Yu-Hsing Liang, Hsinchu (TW); Hsiu-Hua Wang, Hsinchu (TW); Chan-Jui Liu, Hsinchu (TW); Pin-Miao Liu, Hsinchu County (TW); Chun-Cheng Cheng, Hsinchu (TW)

(73) Assignee: Au Optronics Corporation, Hsinchu (TW)

(*) Notice: Subject to any disclaimer, the term of this patent is extended or adjusted under 35 U.S.C. 154(b) by 105 days.

(21) Appl. No.: 16/726,846

(22) Filed: Dec. 25, 2019

(65) Prior Publication Data

US 2020/0373333 A1    Nov. 26, 2020

(30) Foreign Application Priority Data

May 21, 2019 (TW) .................................. 108117473

(51) Int. Cl.
*H01L 27/14* (2006.01)
*H01L 27/12* (2006.01)

(52) U.S. Cl.
CPC .................................. *H01L 27/124* (2013.01)

(58) Field of Classification Search
CPC .................................................. H01L 27/124
USPC ....................................................... 257/774
See application file for complete search history.

(56) References Cited

U.S. PATENT DOCUMENTS

| | | | |
|---|---|---|---|
| 6,972,254 B1* | 12/2005 | Lopatin | H01L 21/28562 257/E21.171 |
| 8,587,128 B2* | 11/2013 | Yang | H01L 21/76844 257/774 |
| 10,269,700 B2* | 4/2019 | Chiu | H01L 23/53204 |
| 10,522,468 B2* | 12/2019 | Ho | H01L 21/76814 |
| 10,714,383 B2* | 7/2020 | Chen | H01L 21/7684 |
| 10,796,954 B2* | 10/2020 | Chang | H01L 21/31116 |
| 10,998,259 B2* | 5/2021 | Tsai | H01L 23/53295 |
| 2002/0175414 A1* | 11/2002 | Teh | H01L 23/5226 257/E23.152 |

(Continued)

FOREIGN PATENT DOCUMENTS

CN    103700595    4/2014
CN    103957660    7/2014

(Continued)

*Primary Examiner* — Ori Nadav
(74) *Attorney, Agent, or Firm* — JCIPRNET (57) ABSTRACT

An array substrate includes a substrate as well as a first insulating layer, a first conductive layer, a second insulating layer, a second conductive layer and a conductive structure sequentially formed thereon. The first insulating layer has a first opening communicated with a through hole of the substrate. The first conductive layer includes a first ring pattern extending from top of the first insulating layer into the first opening. The second insulating layer has a second opening communicated with the first opening. The second conductive layer includes a second ring pattern extending from top of the second insulating layer into the second opening. The first ring pattern laterally protrudes toward an axis of the through hole from the second ring pattern. The conductive structure extends from above the second insulating layer to a bottom surface of the substrate through the first and second openings and the through hole.

11 Claims, 7 Drawing Sheets

(56) References Cited

U.S. PATENT DOCUMENTS

| | | | |
|---|---|---|---|
| 2004/0128964 A1* | 7/2004 | Cheng | F01N 13/017 55/484 |
| 2015/0091187 A1* | 4/2015 | Reber | H01L 24/16 257/774 |
| 2016/0005689 A1* | 1/2016 | Chiu | H01L 23/5226 257/774 |
| 2016/0111324 A1* | 4/2016 | Chiu | H01L 21/76804 438/653 |
| 2016/0190016 A1* | 6/2016 | Blatchford | H01L 21/31116 438/618 |
| 2017/0125346 A1* | 5/2017 | Liu | H01L 23/5386 |
| 2019/0035734 A1 | 1/2019 | Ho et al. | |

FOREIGN PATENT DOCUMENTS

| | | |
|---|---|---|
| CN | 108461465 | 8/2018 |
| JP | 2019008211 | 1/2019 |

\* cited by examiner

ARRAY SUBSTRATE

CROSS-REFERENCE TO RELATED APPLICATION

This application claims the priority benefit of Taiwan application serial no. 108117473, filed on May 21, 2019. The entirety of the above-mentioned patent application is hereby incorporated by reference herein and made a part of this specification.

BACKGROUND

Technical Field

The present disclosure relates to an array substrate used in a display apparatus, and particularly, to an array substrate with a through hole and used in a display apparatus.

Description of Related Art

In regarding design of display apparatus, reducing border area of a display apparatus may improve visual effect. If size of view field of a display apparatus is fixed, an edge of the display apparatus may be closer to a boundary of the view field when a border area of the display apparatus is reduced. On the other hand, if size of a display apparatus is fixed, the display apparatus could have a larger view field when a border area of the display apparatus is reduced. In this way, more pixels can be disposed in the display apparatus without increasing size of the display apparatus, thus resolution of the display apparatus can be improved. Therefore, reducing the border area of display apparatus is important in the field.

SUMMARY

An array substrate used in a display apparatus with reduced border area is provided in embodiments of the present disclosure.

According to some embodiments of the present disclosure, an array substrate is provided. The array substrate comprises a substrate, a first insulating layer, a first conductive layer, a second insulating layer, a second conductive layer and a conductive structure. The substrate has a through hole. The first insulating layer is disposed on the substrate, and has a first opening. The first opening is communicated with the through hole. A first width of the first opening is greater than a width of the through hole. The first conductive layer is disposed on the first insulating layer, and comprises a first ring pattern. The first ring pattern extends into the first opening from a top surface of the first insulating layer, and covers a first sidewall of the first insulating layer that defines the first opening. The second insulating layer is disposed on the first conductive layer, and has a second opening. The second opening is communicated with the first opening. A second width of the second opening is greater than the first width of the first opening. The second conductive layer is disposed on the second insulating layer, and comprises a second ring pattern. The second ring pattern extends into the second opening from a top surface of the second insulating layer and covers a second sidewall of the second insulating layer that defines the second opening. The first ring pattern laterally protrudes toward a central axis of the through hole from the second ring pattern. The conductive structure extends to a surface of the substrate facing away from the first insulating layer from above the second conductive layer via the second opening, the first opening and the through hole.

In some embodiments, the substrate laterally protrudes toward the central axis of the through hole from the first insulating layer.

In some embodiments, a terminal surface of the first ring pattern is substantially coplanar with a sidewall of the substrate that defines the through hole.

In some embodiments, a minimum spacing between the first ring pattern and the central axis of the through hole is greater than a spacing between the central axis and the sidewall of the substrate that defines the through hole.

In some embodiments, the array substrate further comprises a seed layer. The seed layer is disposed between the conductive structure and the substrate.

In some embodiments, the array substrate further comprises: a third insulating layer, disposed on the second conductive layer, and having a third opening, wherein the third opening is communicated with the second opening; and a third conductive layer, disposed on the third insulating layer, and comprising a third ring pattern, wherein the third ring pattern extends into the third opening from a top surface of the third insulating layer and covers a third sidewall of the third insulating layer that defines the third opening, and the conductive structure covers the third ring pattern.

In some embodiments, the second insulating layer laterally protrudes toward the central axis of the through hole from the third insulating layer, and the second ring pattern laterally protrudes toward the central axis from the third ring pattern.

In some embodiments, the second sidewall is substantially coplanar with the third sidewall, and a surface of the second ring pattern facing the second opening is substantially coplanar with a surface of the third ring pattern facing the third opening.

In some embodiments, the third ring pattern further extends into the second opening, and covers a surface of the second ring pattern facing the second opening.

In some embodiments, the third insulating layer laterally protrudes toward the central axis of the through hole from the second insulating layer.

In some embodiments, a surface of the third ring pattern is substantially coplanar with a surface of the first ring pattern.

According to some other embodiments of the present disclosure, an array substrate is provided. The array substrate comprises a substrate, an insulating layer, a conductive layer and a conductive structure. The substrate has a through hole. The insulating layer is disposed on the substrate, and has an opening. The opening is communicated with the through hole. A width of the opening is greater than a width of the through hole. A first angle between a top surface of the substrate and an extending direction of a sidewall of the insulating layer that defines the opening is smaller than a second angle between the top surface of the substrate and a sidewall of the substrate that defines the through hole. The conductive layer is disposed on the insulating layer, and comprises a ring pattern. The ring pattern extends into the opening and covers the sidewall of the insulating layer that defines the opening. The conductive structure extends to a surface of the substrate facing away from the insulating layer from above the conductive layer via the opening and the through hole.

In some embodiments, the first angle is greater than or equal to 20°, and less than 90°. The second angle is greater than 20° and less than or equal to 90°.

As above, the conductive structure according to the embodiments in the present disclosure penetrates through the substrate and the at least one insulating layer formed over the substrate, and covers opposite sides of the array substrate to form a double-sided conductive routing structure. Therefore, the surfaces at opposite sides of the array substrate are both available for the conductive structure to expand, such that routing of the array substrate can be realized at opposite sides of the array substrate. In other words, some portions of the conductive structure may be overlapped with each other, and a footprint area of the conductive structure can be reduced. Therefore, an area of a border region of a display apparatus including the array substrate can be reduced to improve visual effect for users, or a resolution of the display apparatus can be improved. To be more specific, the substrate has a through hole, and the at least one insulating layer has opening(s) communicated with the through hole. The conductive structure extends through the through hole and the opening(s), and covers opposite sides of the array substrate. The width(s) of the opening(s) of the at least one insulating layer is/are greater than the width of the through hole of the substrate. In addition, the angle(s) between the top surface of the substrate and the extending direction(s) of the sidewall(s) of the at least one insulating layer that define(s) the opening(s) is/are less than the angle between the top surface of the substrate and the sidewall of the substrate that defines the through hole. Furthermore, the array substrate further includes at least one conductive layer formed over the substrate. The ring pattern(s) of the at least one conductive layer cover(s) the sidewall(s) of the at least one insulating layer that define(s) the opening(s). In this way, during formation of the conductive structure by using, for example, a plating process, the ring pattern(s) of the at least one conductive layer may be functioned as a seed layer. Therefore, the conductive structure can be successfully filled in the opening(s) of the at least one insulating layer. Furthermore, during formation of the through hole in the substrate by using, for example, a laser drilling process, the ring pattern(s) of the at least one conductive layer may protect the at least one insulating layer from absorbing laser energy and at least partially decomposing. In this way, profile of the opening(s) can be effectively maintained.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
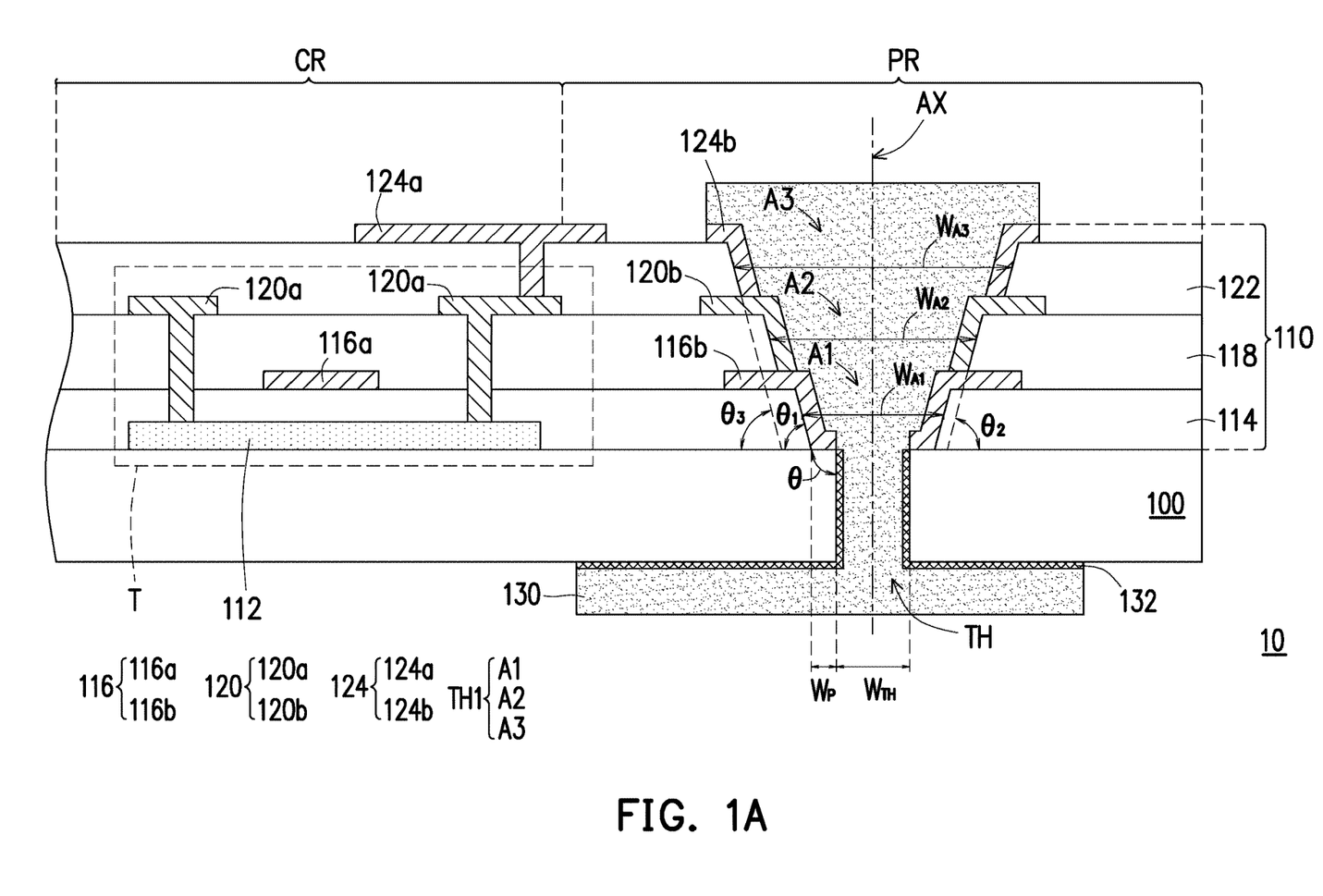
FIG. 1A is a schematic cross-sectional view illustrating an array substrate according to some embodiments of the present disclosure.
Figure 1B:
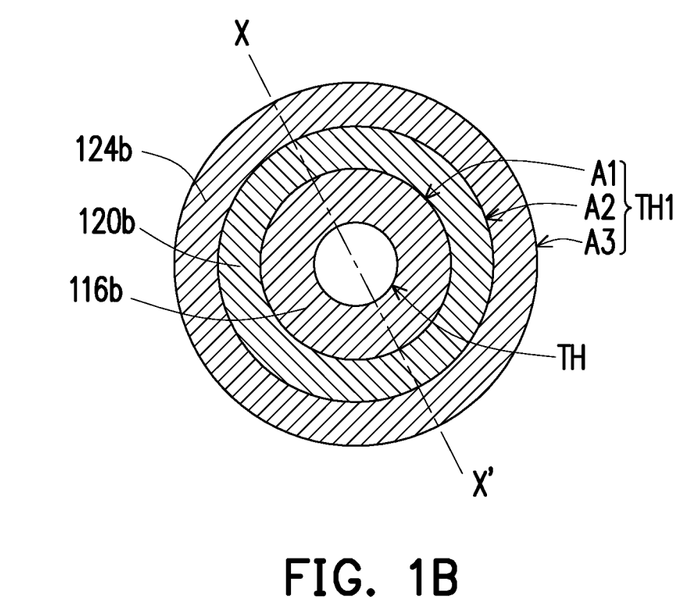
FIG. 1B is a schematic top view illustrating the through hole, the first opening, the second opening and the third opening shown in FIG. 1A.

FIG. 1A is a schematic cross-sectional view illustrating an array substrate 10 according to some embodiments of the present disclosure. FIG. 1B is a schematic top view illustrating the through hole TH, the first opening A1, the second opening A2 and the third opening A3 shown in FIG. 1A.

Referring to FIG. 1A, the array substrate 10 includes a substrate 100 and a device layer 110 formed on the substrate 100. The array substrate 10 may be used in a display apparatus (not shown), and active devices formed in the array substrate 10 may be configured to drive light emitting devices in the display apparatus or to control liquid crystal molecules filled in the display apparatus. For instance, the active devices may include the transistor T shown in FIG. 1A. The substrate 100 has a through hole TH. The through hole TH penetrates through the substrate 100, and extends between opposite sides of the substrate 100 (e.g., top and bottom sides of the substrate 100). In some embodiments, the array substrate 10 has a central region CR and a peripheral region PR surrounding the central region CR, and the through hole TH is located within the peripheral region PR. However, in alternative embodiments, the through hole TH may be located within the central region CR. Even though only a single through hole TH is depicted in FIG. 1A, the substrate 100 may actually have multiple through holes TH. These through holes TH may be arranged along a single direction, arranged along a boundary of the central region CR, or arbitrarily distributed within the central region CR. In some embodiments, the substrate 100 may be a flexible substrate. For instance, a material of the substrate 100 may include polyamide, polymethyl methacrylate (PMMA), polyethylene naphthalate (PEN), polyethylene terephthalate (PET), fiber reinforced plastic (FRP), the like or combinations thereof. In alternative embodiments, the substrate 100 is a non-flexible substrate, such as a glass substrate. In addition, in some embodiments, the through hole TH may be formed by using a laser drilling process. In these embodiments, an angle θ between a surface of the substrate 100 (e.g., a top surface of the substrate 100) and an extending direction of the sidewall of the substrate 100 that defines the through hole TH may approximate 90°. Furthermore, a width $W_{TH}$ of the through hole TH (e.g., an aperture of the through hole TH) may range from 5 μm to 100 μm.

In some embodiments, the device layer 110 formed on the substrate 100 includes a semiconductor layer 112. The semiconductor layer 112 may be functioned as a channel structure of the transistor T, and may be disposed within the central region CR. For instance, the transistor T is a thin film transistor (TFT). Although not shown, the device layer 110 may actually include multiple semiconductor layers 112, and these semiconductor layers 112 may be arranged in an array within the central region CR of the array substrate 10. In some embodiments, a material of the semiconductor layer 112 includes low temperature crystalline silicon (LTPS), amorphous silicon, oxide semiconductor (e.g., indium gallium zinc oxide (IGZO) or the like.

The device layer 110 further includes a first insulating layer 114. In some embodiments, the first insulating layer 114 spans within the central region CR and the peripheral region PR of the array substrate 10, and covers the semiconductor layer 112. A portion of the first insulating layer 114 covering the semiconductor layer 112 may be functioned as a gate dielectric layer of the transistor T. In addition, another portion of the first insulating layer 114 has a first opening A1. The first opening A1 is communicated with the underlying through hole TH, and a width $W_{A1}$ of the first opening A1 is greater than the width $W_{TH}$ of the through hole TH. For instance, the width $W_{A1}$ of the first opening A1 may range from 10 µm to 105 µm. In some embodiments, substantially the whole through hole TH may be overlapped with the overlying first opening A1 along a vertical projection direction. In these embodiments, the substrate 100 could be regarded as laterally protruding toward a central axis AX of the through hole TH from the first insulating layer 114, and the protruding portion of the substrate 100 forms a platform. For instance, a width $W_P$ of the protruding portion of the substrate 100 may range from 3 µm to 20 µm. In addition, in some embodiments, a sidewall of the first insulating layer 114 defining the first opening A1 may be an inclined plane, such that the first opening A1 may fan out along a direction away from the substrate 100. In these embodiments, an angle θ1 between a surface of the substrate 100 (e.g., the top surface of the substrate 100) and an extending direction of the sidewall of the first insulating layer 114 that defines the first opening A1 is smaller than the angle θ between the surface of the substrate 100 and the extending direction of the sidewall of the substrate 100 that defines the through hole TH. For instance, the angle θ1 may be greater than or equal to 20°, and less than about 90°. In addition, in those embodiments where the sidewall of the first insulating layer 114 that defines the first opening A1 is an inclined plane, even a minimum value of the width $W_{A1}$ of the first opening A1 may be greater than the width $W_{TH}$ of the through hole TH as viewing from the same cross-section (e.g., the cross-section along line X-X' as shown in FIG. 1B). A material of the first insulating layer 114 may include silicon oxide, silicon nitride, gallium nitride, aluminum oxide, titanium oxide, aluminum nitride, the like or combinations thereof. Moreover, a method for forming the first opening A1 in the first insulating layer 114 may include a lithography process and an etching process.

The device layer 110 further includes a first conductive layer 116. The first conductive layer 116 is formed on the first insulating layer 114. In some embodiments, the first conductive layer 116 includes a gate pattern 116a and a first ring pattern 116b. The gate pattern 116a is disposed within the central region CR of the array substrate 10, and may be functioned as a gate electrode of the transistor T. The gate electrode 116a is overlapped with the semiconductor layer 112 along the vertical projection direction, and the portion of the first insulating layer 114 functioned as the gate dielectric layer is located between the gate pattern 116a and the semiconductor layer 112. On the other hand, the first ring pattern 116b extends into the first opening A1 from a top surface of the first insulating layer 114, and covers the sidewall of the first insulating layer 114 that defines the first opening A1. It should be noted that, only two opposite portions of the first ring pattern 116b could be observed from FIG. 1A. However, a top view shape of the first ring pattern 116b may substantially be a ring shape, which is partly depicted in FIG. 1B. For instance, the top view shape of the first ring pattern 116b may substantially be a circular ring, an oval ring, a polygonal ring or the like, and each of these ring shapes could be a close ring or an open ring. In some embodiments, the first ring pattern 116b further extends to the protruding portion of the substrate 100 that is exposed in the first opening A1. In these embodiments, a terminal surface of the first ring pattern 116b may be substantially coplanar with the sidewall of the substrate 100 that defines the through hole TH. In addition, in these embodiments, the through hole TH could be regarded as further extending along the terminal surface of the first ring pattern 116b. A material of the first conductive layer 116 may include Cu, Ni, Mo, Ti, Al, W, Ag, Au, or at least one of the alloys of combinations of these metal materials. In addition, in some embodiments, a blanket conductive material layer may be initially formed, and a lithography process and an etching process may be performed to pattern this blanket conductive material layer, so as to form the first conductive layer 116 including the gate pattern 116a and the first ring pattern 116b.

In some embodiments, the device layer 110 further includes a second insulating layer 118. The second insulating layer 118 spans within the central region CR and the peripheral region PR of the array substrate 10, and covers the first conductive layer 116. The second insulating layer 118 has a second opening A2. The second opening A2 is communicated with the underlying first opening A1, and a width $W_{A2}$ of the second opening A2 is greater than the width $W_{A1}$ of the first openings A1. For instance, the width $W_{A2}$ of the second opening A2 may range from 15 µm to 110 µm. In some embodiments, substantially the whole first opening A1 is overlapped with the overlying second opening A2. In these embodiments, the first insulating layer 114 could be regarded as laterally protruding toward the central axis AX of the through hole TH from the second insulating layer 118. As similar to the first insulating layer 114, a sidewall of the second insulating layer 118 that defines the second opening A2 may be an inclined plane, such that the second opening A2 may fan out along a direction away from the substrate 100. In some embodiments, an angle θ2 between a surface of the substrate 100 (e.g., a top surface of the substrate 100) and an extending direction of the sidewall of the second insulating layer 118 that defines the second opening A2 may be substantially identical to the angle θ1 between the surface of the substrate 100 and the extending direction of the sidewall of the first insulating layer 114 that defines the first opening A1. In alternative embodiments, the angle θ2 may be greater or less than the angle θ1. For instance, the angle θ2 may range from 20° to 90°. In addition, in those embodiments where the sidewall of the second insulating layer 118 that defines the second opening A2 is an inclined plane, even a minimum value of the width $W_{A2}$ of the second opening A2 may be greater than a maximum value of the width $W_{A1}$ of the first opening A1. A material of the second insulating layer 118 may include silicon oxide, silicon nitride, gallium nitride, aluminum oxide, titanium oxide, aluminum nitride, the like or combinations thereof. In addition, a method for forming the second opening A2 in the second insulating layer 118 may include a lithography process and an etching process.

In some embodiments, the device layer 110 further includes a second conductive layer 120. The second conductive layer 120 is formed on the second insulating layer 118. In some embodiments, the second conductive layer 120 includes source/drain electrode patterns 120a and a second ring pattern 120b. The source/drain electrode patterns 120a are disposed within the central region CR of the array substrate 10. A pair of the source/drain electrode patterns 120a are located at opposite sides of the gate pattern 116a, and may penetrate through the second insulating layer 118 and the first insulating layer 114 to electrically connect to the semiconductor layer 112, and may be functioned as source and drain electrodes of the transistor T. On the other hand, the second ring pattern 120b extends into the second opening A2 from a top surface of the second insulating layer 118, and covers the sidewall of the second insulating layer 118 that defines the second opening A2. As similar to the description of the first ring pattern 116b, a top view shape of the second ring pattern 120b may substantially be a ring shape (partly depicted in FIG. 1B), even though only two opposite portions of the second ring pattern 120b could be observed from FIG. 1A. For instance, the top view shape of the second ring pattern 120b may substantially be a circular ring, an oval ring, a polygonal ring or the like, and each of these ring shapes could be a close ring or an open ring. In those embodiments where the first insulating layer 114 laterally protrudes toward the central axis AX of the through hole TH from the second insulating layer 118, the first ring pattern 116b could be regarded as laterally protruding toward the central axis AX of the through hole TH from the second ring pattern 120b, so as to form a platform. A material of the second conductive layer 120 may include Cu, Ni, Mo, Ti, A1, W, Ag, Au or at least one of the alloys of combinations of these metal materials. In addition, in some embodiments, a blanket conductive material layer may be initially formed, then a lithography process and an etching process may be performed to pattern the blanket conductive material layer, so as to form the second conductive layer 120 including the source/drain electrode patterns 120a and the second ring pattern 120b. By having the through hole TH, the first opening A1 and the second opening A2 wider than the underlying one, the narrowest through hole TH can be accurately formed without damaging the device layer 110.

In some embodiments, the device layer 110 further includes a third insulating layer 122. As similar to the first insulating layer 114 and the second insulating layer 118, the third insulating layer 122 has a third opening A3. The third opening A3 is communicated with the underlying second opening A2, and a width $W_{A3}$ of the third opening A3 is greater than the width $W_{A2}$ of the second opening A2. For instance, the width $W_{A3}$ of the third opening A3 may range from 20 μm to 115 μm. In some embodiments, substantially the whole second opening A2 is overlapped with the overlying third opening A3 along the vertical projection direction. In these embodiments, the second insulating layer 118 could be regarded as laterally protruding toward the central axis AX of the through hole TH from the third insulating layer 122. In addition, as similar to the first insulating layer 114 and the second insulating layer 118, a sidewall of the third insulating layer 122 that defines the third opening A3 may be an inclined plane. In some embodiments, an angle θ3 between a surface of the substrate 100 (e.g., the top surface of the substrate 100) and an extending direction of the sidewall of the third insulating layer 122 that defines the third opening A2, the angle θ1 between the surface of the substrate 100 and the extending direction of the sidewall of the first insulating layer 114 that defines the first opening A1, and the angle θ2 between the surface of the substrate 100 and the extending direction of the sidewall of the second insulating layer 118 that defines the second opening A2 are substantially equal to one another. In alternative embodiments, at least two of the angle θ1, the angle θ2 and the angle θ3 are different from one another. For instance, the angle θ3 may range from 20° to 90°. In addition, in those embodiments where the sidewall of the third insulating layer 122 that defines the third opening A3 is an inclined plane, even a minimum value of a width $W_{A3}$ of the third opening A3 may be greater than a maximum value of the width $W_{A2}$ of the second opening A2. A material of the third insulating layer 122 may include silicon oxide, silicon nitride, gallium nitride, aluminum oxide, titanium oxide, aluminum nitride, the like or combinations thereof. In addition, a method for forming the third opening A3 in the third insulating layer 122 may include a lithography process and an etching process.

In some embodiments, the device layer 110 further includes a third conductive layer 124. The third conductive layer 124 is formed on the third insulating layer 122. In some embodiments, the third conductive layer 124 includes a routing pattern 124a and a third ring pattern 124b. The routing pattern 124a is disposed within the central region CR of the array substrate 10, and may penetrate through the third insulating layer 122 and electrically connect to one of the source/drain electrode patterns 120a of the transistor T. On the other hand, the third ring pattern 124b extends into the third opening A3 from a top surface of the third insulating layer 122, and covers the sidewall of the third insulating layer 122 that defines the third opening A3. As similar to the description of the first ring pattern 116b, a top view shape of the third ring pattern 124b may substantially be a ring shape (partly depicted in FIG. 1B), even though only two opposite portions of the third ring pattern 124b could be observed from FIG. 1A. For instance, the top view shape of the third ring pattern 124b may substantially be a circular ring, an oval ring, a polygonal ring or the like, and each of these ring shapes could be a close ring or an open ring. In those embodiments where the second insulating layer 118 laterally protrudes toward the central axis AX of the through hole TH from the third insulating layer 122, the second ring pattern 120b could be regarded as laterally protruding toward the central axis AS of the through hole TH from the third ring pattern 124b, so as to form a platform. A material of the third conductive layer 124 may include Cu, Ni, Mo, Ti, Al, W, Ag, Au or at least one of the alloys of combinations of these metal materials. In addition, in some embodiments, a blanket conductive material layer may be initially formed, and a lithography process and an etching process may be performed to pattern the blanket conductive material layer, so as to form the third conductive layer 124 including the routing pattern 124a and the third ring pattern 124b.

Referring to FIG. 1B, the depicted boundaries of the through hole TH, the first opening A1, the second opening A2 and the third opening A3 are top edges of the through hole TH, the first opening A1, the second opening A2 and the third opening A3, respectively. In addition, at least the conductive structure 130 and the seed layer 132 are omitted in FIG. 1B. As shown in FIG. 1B, the top view shapes of the through hole TH, the first opening A1, the second opening A2 and the third opening A3 may be concentric circles, and the top view shapes of the first ring pattern 116b, the second ring pattern 120b and the third ring pattern 124b may be circular rings. The first ring pattern 116b is exposed between the top edges of the through hole TH and the first opening A1; the second ring pattern 120b is exposed between the top edges of the first opening A1 and the second opening A2; and the third ring pattern 124b is exposed between the top edges of the second opening A2 and the third opening A3.

Referring to FIG. 1A and FIG. 1B, the device layer 110 could be regarded as having a through hole TH1 that consists of the first opening A1, the second opening A2 and the third opening A3. The through hole TH1 of the device layer 110 is communicated with the through hole TH of the substrate 100. In some embodiments, the through hole TH1 has a stepped sidewall. In these embodiments, an insulating layer of the device layer 110 laterally protrudes toward the central axis AX of the through hole TH from another overlying insulating layer of the device layer 110, so as to form a platform. In addition, some portions of the conductive layers of the device layer 110 cover the sidewall of the through hole TH1. In some embodiments, substantially the entire sidewall of the through hole TH1 is covered by these portions of the conductive layers. Moreover, in the embodiments described with reference to FIG. 1A, the sidewalls of the insulating layers of the device layer 110 that define the through hole TH1 are all inclined planes. However, in alternative embodiments, the sidewalls of the insulating layers of the device layer 110 that define the through hole TH1 are not all inclined planes, and some of these sidewalls is/are vertical wall(s) substantially perpendicular to the top surface of the substrate 100. For instance, the sidewalls of the insulating layers that define the through hole TH1 may have inclined plane(s) and vertical wall(s), and the inclined plane(s) may face toward the vertical wall(s).

Even though the device layer 110 depicted in FIG. 1A includes 3 insulating layers and 3 conductive layers, the device layer 110 may include more or less than 3 insulating layers and include more or less than 3 conductive layers, as long as the openings of these insulating layers are communicated with one another to form a through hole, and some portions of these conductive layer cover a sidewall of this through hole. The present disclosure is not limited to the amount of the insulating layers and the conductive layers of the device layer 110. In addition, only an exemplary configuration of the transistor T is depicted in FIG. 1A. Those skilled in the art may modify the configuration of the transistor T (i.e., the configuration of the semiconductor layer 112, the gate pattern 116a and the source/drain electrode patterns 120a) according to process requirements, the present disclosure is not limited thereto.

Referring to FIG. 1A, the array substrate 10 further includes a conductive structure 130. The conductive structure 130 extends to a surface of the substrate 100 facing away from the device layer 110 (e.g., a bottom surface of the substrate 100) from a surface of the device layer 110 (e.g., a top surface of the device layer 110) via the through hole TH1 and the through hole TH. In some embodiments, the conductive structure 130 covers a portion of the third ring pattern 124b that is located above the third insulating layer 122, and electrically connects to the third ring pattern 124b. Moreover, the conductive structure 130 covers the portions of the first ring pattern 116b, the second ring pattern 120b and the third ring pattern 124b previously exposed in the through hole TH1. In other words, the previously exposed portions of the first ring pattern 116b, the second ring pattern 120b and the third ring pattern 124b may define a sidewall of a portion of the conductive structure 130 extending through the through hole TH1. In addition, in some embodiments, a driver chip (not shown) may be attached to and electrically connected with the conductive structure 130. As such, the conductive structure 130 may receive signals from the driver chip, and transmit the signals to the transistor T through the routing pattern 124a (a portion of the routing pattern 124a (not shown) may be connected to the third ring pattern 124b). For instance, the driver chip may be attached to a portion of the conductive structure 130 extending along the bottom surface of the substrate 100 facing away from the device layer 110. In some embodiments, a material of the conductive structure 130 includes Cu, Ni, Cr, Sn, Ag, Au, the like or combinations thereof, and a method for forming the conductive structure 130 may include a plating process.

In those embodiments where the conductive structure 130 is formed by a plating process, a seed layer 132 may be disposed between the conductive structure 130 and the substrate 100. In these embodiments, a portion of the seed layer 132 is located between the bottom surface of the substrate 100 and the conductive structure 130, and another portion of the seed layer 132 is located between the conductive structure 130 and a sidewall of the substrate 100 that defines the through hole TH. In addition, in some embodiments, the seed layer 132 is formed on a surface of the substrate 100 by utilizing a ring opening reaction and an ion exchange reaction. In this way, the formed seed layer 132 may not extend onto surfaces of the conductive layers (including the first conductive layer 116, the second conductive layer 120 and the third conductive layer 124) and the third insulating layer 122. In some embodiments, the seed layer 132 may initially cover the whole exposed surface of the substrate 100. After forming the conductive structure 130, portions of the seed layer 132 not covered by the conductive structure 130 may be removed, so as to form the seed layer 132 as shown in FIG. 1A. In addition, portions of the first ring pattern 116b, the second ring pattern 120b and the third ring pattern 124b located in the through hole TH1 may be functioned as a seed layer (as similar to the seed layer 132) during the plating process for forming the conductive structure 130. In this way, the conductive structure 130 could be successfully formed in the through hole TH1 and over the third ring pattern 124b.

In summary, the array substrate 10 according to embodiments of the present disclosure includes the substrate 100, at least one insulating layer formed over the substrate 100 (e.g., the first insulating layer 114, the second insulating layer 118 and the third insulating layer 122) and the conductive structure 130. The conductive structure 130 penetrates through the substrate 100 and the at least one insulating layer, and extends on opposite sides of the array substrate 10, so as to be a double-sided conductive routing structure. Therefore, the surfaces at opposite sides of the array substrate 10 are both available for the conductive structure 130 to expand, such that routing of the array substrate 10 can be realized at opposite sides of the array substrate 10. In other words, some portions of the conductive structure 130 may be overlapped with each other, and a footprint area of the conductive structure 130 can be reduced. In those embodiments where the conductive structure 130 is disposed within the peripheral region PR of the array substrate 10, reducing the footprint area of the conductive structure 130 results in reduction of an area of the peripheral region PR. In these embodiments, if a total size of the array substrate 10 is fixed, the central region CR functioned as view field could have a larger area when the area of the peripheral region PR is reduced. Therefore, resolution of the display apparatus including the array substrate 10 can be improved. On the other hand, if the area of the central region CR of the array substrate 10 is fixed, an edge of the array substrate 10 can be closer to a boundary of the central region CR (functioned as the view field) when the area of the peripheral region PR is reduced. In this way, the display apparatus including the array substrate 10 may have a narrower border region, or may be a display apparatus without a border region.

To be more specific, the substrate 100 of the array substrate 10 has the through hole TH, and the at least one insulating layer formed on the substrate 100 has opening(s) (e.g., the first opening A1, the second opening A2 and the third opening A3) communicated with the through hole TH. The conductive structure 130 extends through the through hole TH of the substrate and the opening(s) of the at least one insulating layer, and covers opposite sides of the substrate 100. Width(s) of the opening(s) of the at least one insulating layer (e.g., the width $W_{A1}$, the width $W_{A2}$ and the width $W_{A3}$) is/are greater than the width $W_{TH}$ of the through hole TH. In addition, angle(s) between the top surface of the substrate 100 and the extending direction(s) of the sidewall(s) of the at least one insulating layer that define(s) the opening(s) (e.g., the angle θ1, the angle θ2 and the angle θ3) is/are less than the angle θ between the top surface of the substrate 100 and the sidewall of the substrate 100 that defines the through hole TH. Moreover, the array substrate 10 further includes at least one conducive layer formed over the substrate 100 (e.g., the first conductive layer 116, the second conductive layer 120 and the third conductive layer 124). The ring pattern(s) of the at least one conductive layer (e.g., the first ring pattern 116b, the second ring pattern 120b and the third ring pattern 124b) cover(s) the sidewall(s) of the at least one insulating layer that define(s) the opening(s). As such, when the conductive structure 130 is, for example, formed by a plating process, the ring pattern(s) of the at least one conductive layer may be functioned as a seed layer during the plating process. In this way, the conductive structure 130 can be better filled in the opening(s) of the at least one insulating layer. Moreover, when the through hole TH in the substrate 100 is formed by, for example, a laser drilling process, the ring pattern(s) of the at least one conductive layer may protect the at least one insulating layer from at least partially decomposing as absorbing the energy of the laser. Therefore, dimension and profile of the opening(s) of the at least one insulating layer can be effectively maintained.

In some embodiments, the at least one insulating layer includes multiple insulating layers, and the at least one conductive layer include multiple conductive layers. For instance, the insulating layers include the first insulating layer 114 and the second insulating layer 118, and the conductive layers include the first conductive layer 116 and the second conductive layer 120. The first insulating layer 114 is located between the substrate 100 and the second insulating layer 118, and the width $W_{A1}$ of the first opening A1 of the first insulating layer 114 is greater than the width $W_{A2}$ of the second opening A2 of the second insulating layer 118. The first ring pattern 116b of the first conductive layer 116 extends onto the sidewall of the first insulating layer 114 that defines the first opening A1 from the top surface of the first insulating layer 114, and the second ring pattern 120b of the second conductive layer 120 extends onto the sidewall of the second insulating layer 118 that defines the second opening A2 from the top surface of the second insulating layer 118. In addition, the first ring pattern 114b laterally protrudes toward the central axis AX of the through hole TH of the substrate 100 from the second ring pattern 120b, so as to form a platform.

Figure 2:
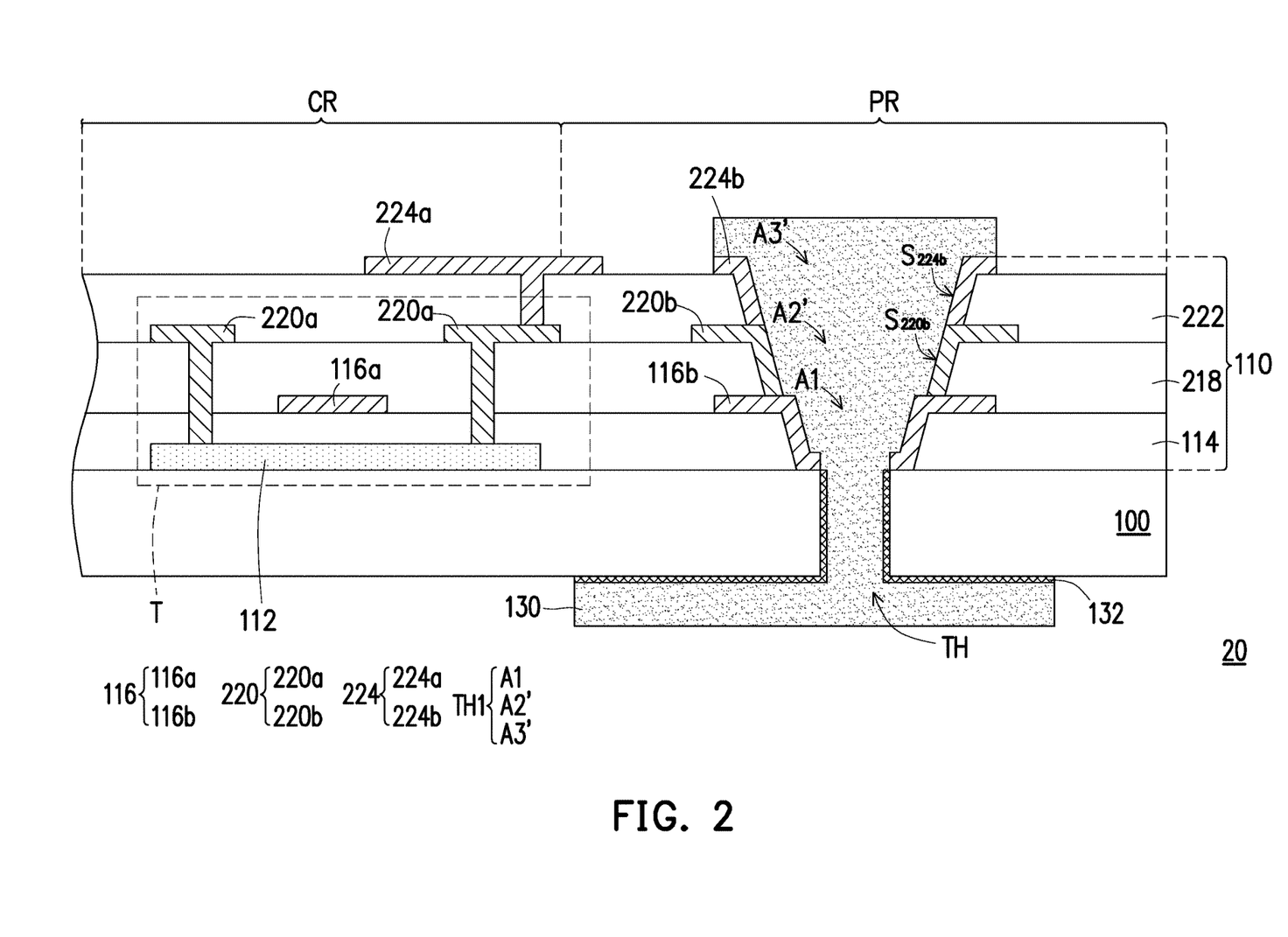
FIG. 2 and FIG. 3 are schematic cross-sectional views illustrating array substrates according to some other embodiments of the present disclosure.

FIG. 2 is a schematic cross-sectional view illustrating an array substrate 20 according to some other embodiments of the present disclosure. The array substrate 20 as shown in FIG. 2 is similar to the array substrate 10 as shown in FIG. 1A. Only the difference therebetween will be described, the same or the like parts would not be repeated again. In addition, like numeral references represent similar components (e.g., the second insulating layer 118 and the second insulating layer 218).

Referring to FIG. 1A and FIG. 2, the difference between the array substrate 20 shown in FIG. 2 and the array substrate 10 shown in FIG. 1A mainly lies in that a second insulating layer 218 of the array substrate 20 does not laterally protrude toward the central axis AX of the through hole TH from a third insulating layer 222. In some embodiments, as shown in FIG. 2, a sidewall of the second insulating layer 218 that defines a second opening A2' is substantially coplanar with a sidewall of the third insulating layer 222 that defines a third opening A3'. In these embodiments, a surface $S_{220b}$ of the second ring pattern 220b facing the second opening A2' may be substantially coplanar with a surface $S_{224b}$ of the third ring pattern 224b facing the third opening A3'. On the other hand, source/drain electrode patterns 220a of the second conductive layer 220 and a routing pattern 224a of the third conductive layer 224 may be similar to the source/drain electrode patterns 120a and the routing pattern 124a as shown in FIG. 1A, respectively.

Figure 3:
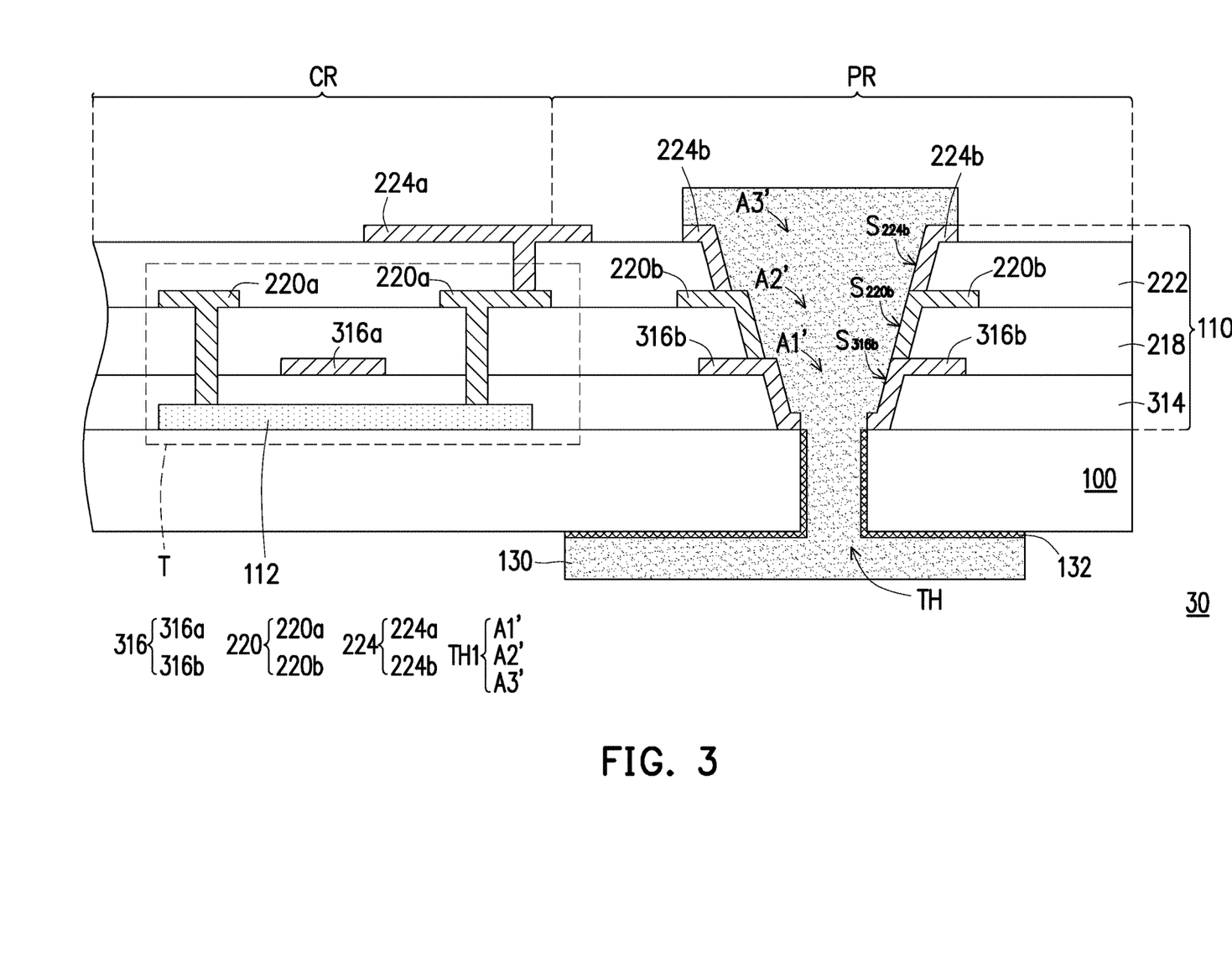

FIG. 3 is a schematic cross-sectional view illustrating an array substrate 30 according to some other embodiments of the present disclosure. The array substrate 30 as shown in FIG. 3 is similar to the array substrate 20 as shown in FIG. 2. Only the difference therebetween will be described, the same or the like parts would not be repeated again. In addition, like numeral references represent similar components (e.g., the first insulating layer 314 and the first insulating layer 114).

Referring to FIG. 2 and FIG. 3, the difference between the array substrate 30 shown in FIG. 3 and the array substrate 20 shown in FIG. 2 mainly lies in that at least a portion of the first insulating layer 314 of the array substrate 30 does not laterally protrude toward the central axis AX of the through hole TH from the second insulating layer 218. In some embodiments, as shown in FIG. 3, a portion of a sidewall of the first insulating layer 314 that defines a first opening A1', the sidewall of the second insulating layer 218 that defines the second opening A2', and the sidewall of the third insulating layer 222 that defines the third opening A3' may be coplanar with one another. Correspondingly, a surface $S_{316b}$ of a portion of a first ring pattern 316b of a first conductive layer 316, the surface $S_{220b}$ of the second ring pattern 220b facing the second opening A2', and the surface $S_{224b}$ of the third ring pattern 224b facing the third opening A3' may be substantially coplanar with one another. On the other hand, a gate pattern 316a of the first conductive layer 316 is similar to the gate pattern 116a as shown in FIG. 1A.

Figure 4:
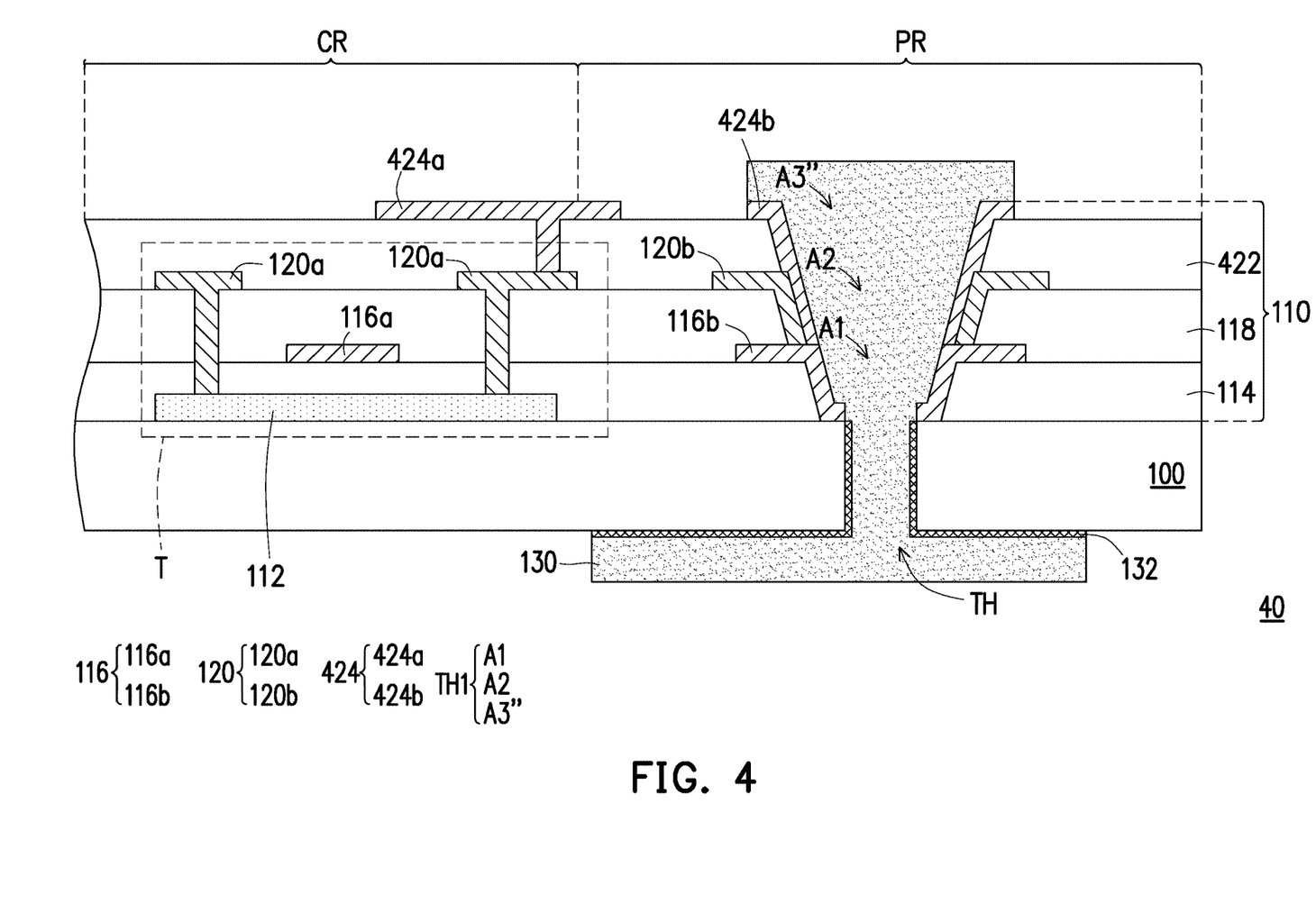
FIG. 4 and FIG. 5A are schematic cross-sectional views illustrating array substrates according to alternative embodiments of the present disclosure.

FIG. 4 is a schematic cross-sectional view illustrating an array substrate 40 according to alternative embodiments of the present disclosure. The array substrate 40 as shown in FIG. 4 is similar to the array substrate 10 as shown in FIG. 1A. Only the difference therebetween will be described, the same or the like parts would not be repeated again. In addition, like numeral references represent similar components (e.g., the third insulating layer 422 and the third insulating layer 122).

Referring to FIG. 1A and FIG. 4, the difference between the array substrate 40 shown in FIG. 4 and the array substrate 10 as shown in FIG. 1A mainly lies in that a third ring pattern 424b of the third conductive layer 424 of the array substrate 40 further extends into the second opening A2. As such, a portion of the second ring pattern 120b not overlapped with the third insulating layer 422 may be covered by the third ring pattern 424b. In other words, a top surface of a portion of the second ring pattern 120b laterally protruding from the third insulating layer 422 as well as a sidewall of such portion of the second ring pattern 120b facing the second opening A2 may both be covered by the third ring pattern 424b. In addition, the third ring pattern 424b may further in contact with the first ring pattern 116b. On the other hand, a routing pattern 424a of the third conductive layer 424 is similar to the routing pattern 124a as shown in FIG. 1A. In some embodiments, as shown in FIG. 4, the third insulating layer 422 laterally protrudes toward the central axis AX of the through hole TH from the second insulating layer 118. However, in alternative embodiments, a sidewall of the third insulating layer 422 that defines a third opening A3" may be substantially coplanar with the sidewall of the second insulating layer 118 that defines the second opening A2, or the second insulating layer 118 may laterally protrude toward the central axis AX of the through hole TH from the third insulating layer 422. In addition, in some embodiments, a surface of the third ring pattern 424b facing the second opening A2 and the third opening A3" is substantially coplanar with a surface of the first ring pattern 116b facing the first opening A1. In other embodiments, the third ring pattern 424b further extends into the first opening A1, and covers the surface of the first ring pattern 116b facing the first opening A1.

Figure 5A:
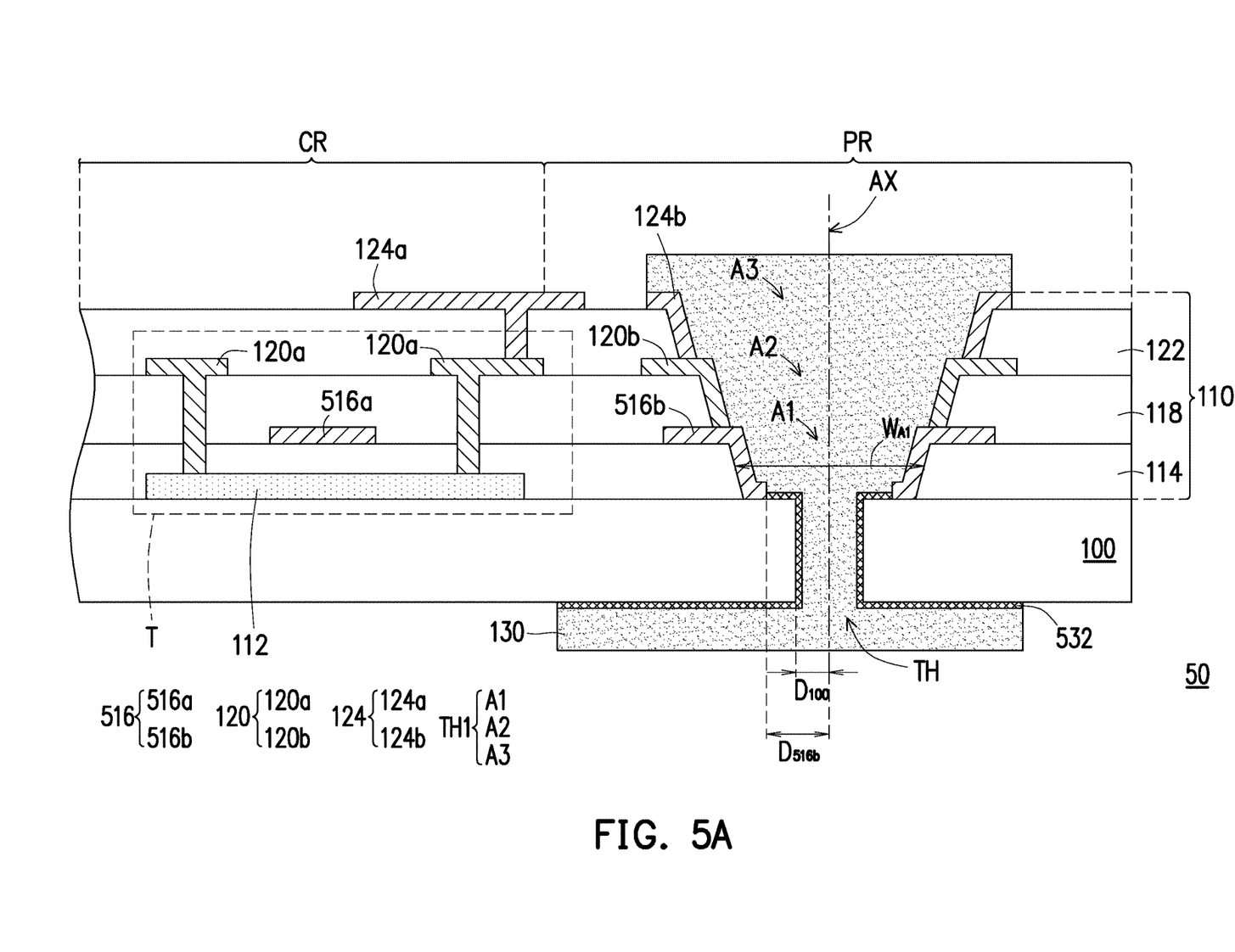
Figure 5B:
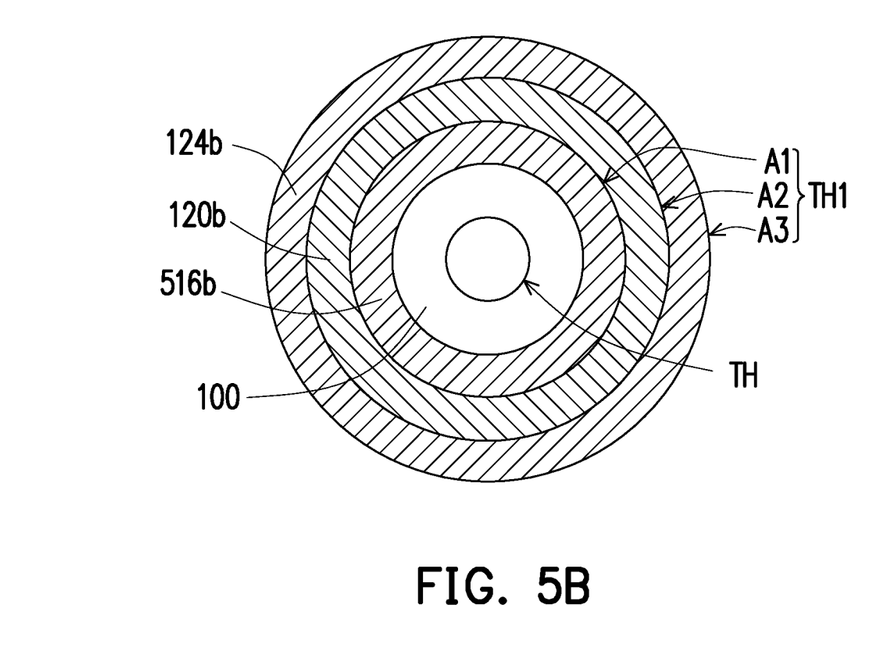
FIG. 5B is a schematic top view illustrating the through hole, the first opening, the second opening and the third opening shown in FIG. 5A.

FIG. 5A is a schematic cross-sectional view illustrating an array substrate 50 according to alternative embodiments of the present disclosure. FIG. 5B is a schematic top view illustrating the through hole TH, the first opening A1, the second opening A2 and the third opening A3 shown in FIG. 5A. The array substrate 50 as shown in FIG. 5A is similar to the array substrate 10 as shown in FIG. 1A. Only the difference therebetween will be described, the same or the like parts would not be repeated again. In addition, like numeral references represent similar components (e.g., the first ring pattern 516b and the first ring pattern 116b).

Referring to FIG. 1A and FIG. 5A, the difference between the array substrate 50 shown in FIG. 5A and the array substrate 10 shown in FIG. 1A mainly lies in that a first ring pattern 516b of the array substrate 50 does not extend to an edge of the through hole TH of the substrate 100. As shown in FIG. 5A, the first ring pattern 516b extends to the protruding portion of the substrate 100 located in the first opening A1 through the sidewall of the first insulating layer 114 that defines the first opening A1, but does not reach to the edge of the through hole TH. As such, a minimum spacing $D_{516b}$ between the first ring pattern 516b and the central axis AX of the through hole TH is greater than a spacing $D_{100}$ between the central axis AX and the sidewall of the substrate 100 that defines the through hole TH, and less than the width $W_{A1}$ of the first opening A1. On the other hand, a gate pattern 516a of the first conductive layer 516 is similar to the gate pattern 116a as shown in FIG. 1A. In some embodiments, a seed layer 532 extends to a top surface of a portion of the substrate 100 located in the first opening A1 from the bottom surface of the substrate 100 opposite to the first insulating layer 114 via the sidewall of the substrate 100 that defines the through hole TH, and is in contact with the first ring pattern 516b. In the embodiments described with reference to FIG. 5A, during forming the through hole TH in the substrate 100 by, for example, a laser drilling process, only a single material (i.e., the material of the substrate 100) receives the energy of laser and decomposes. Therefore, precision of the process for forming the through hole TH (e.g., the laser drilling process) can be improved.

Referring to FIG. 5A and FIG. 5B, the depicted boundaries of the through hole TH, the first opening A1, the second opening A2 and the third opening A3 are top edges of the through hole TH, the first opening A1, the second opening A2 and the third opening A3, respectively. In addition, at least the conductive structure 130 and the seed layer 532 are omitted in FIG. 5B. As shown in FIG. 5B, the first ring pattern 516b does not extend to the boundary of the through hole TH of the substrate 100. In other words, an inner boundary of the ring pattern 516b is not in contact with the boundary of the through hole TH, and a portion of the substrate 100 surrounding the through hole TH is not overlapped with the first ring pattern 516b along the vertical projection direction.

As above, the conductive structure according to the embodiments in the present disclosure penetrates through the substrate and the at least one insulating layer formed over the substrate, and covers opposite sides of the array substrate to form a double-sided conductive routing structure. Therefore, the surfaces at opposite sides of the array substrate are both available for the conductive structure to expand, such that routing of the array substrate can be realized at opposite sides of the array substrate. In other words, some portions of the conductive structure may be overlapped with each other, and a footprint area of the conductive structure can be reduced. Therefore, an area of a border region of a display apparatus including the array substrate can be reduced to improve visual effect for users, or a resolution of the display apparatus can be improved. To be more specific, the substrate has a through hole, and the at least one insulating layer has opening(s) communicated with the through hole. The conductive structure extends through the through hole and the opening(s), and covers opposite sides of the array substrate. The width(s) of the opening(s) of the at least one insulating layer is/are greater than the width of the through hole of the substrate. In addition, the angle(s) between the top surface of the substrate and the extending direction(s) of the sidewall(s) of the at least one insulating layer that define(s) the opening(s) is/are less than the angle between the top surface of the substrate and the sidewall of the substrate that defines the through hole. Furthermore, the array substrate further includes at least one conductive layer formed over the substrate. The ring pattern(s) of the at least one conductive layer cover(s) the sidewall(s) of the at least one insulating layer that define(s) the opening(s). In this way, during formation of the conductive structure by using, for example, a plating process, the ring pattern(s) of the at least one conductive layer may be functioned as a seed layer. Therefore, the conductive structure can be successfully filled in the opening(s) of the at least one insulating layer. Furthermore, during formation of the through hole in the substrate by using, for example, a laser drilling process, the ring pattern(s) of the at least one conductive layer may protect the at least one insulating layer from absorbing laser energy and at least partially decomposing. In this way, profile of the opening(s) can be effectively maintained.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An array substrate, comprising:
    a substrate, having a through hole;
    a first insulating layer, disposed on the substrate, and having a first opening, wherein the first opening is communicated with the through hole, and a first width of the first opening is greater than a width of the through hole;
    a first conductive layer, disposed on the first insulating layer, and comprising a first ring pattern, wherein the first ring pattern extends into the first opening from a top surface of the first insulating layer, and covers a first sidewall of the first insulating layer that defines the first opening;
    a second insulating layer, disposed on the first conductive layer, and having a second opening, wherein the second opening is communicated with the first opening, and a second width of the second opening is greater than the first width of the first opening; and a second conductive layer, disposed on the second insulating layer, and comprising a second ring pattern, wherein the second ring pattern extends into the second opening from a top surface of the second insulating layer and covers a second sidewall of the second insulating layer that defines the second opening, and the first ring pattern laterally protrudes toward a central axis of the through hole from the second ring pattern; and a conductive structure, extending to a surface of the substrate facing away from the first insulating layer from above the second conductive layer via the second opening, the first opening and the through hole, wherein a minimum of the first width of the first opening is greater than or equal to a maximum of the width of the through hole and an orthogonal projection of the first ring pattern on the substrate is completely outside the through hole with the proviso that a central axis of the through hole passes through the first opening inside the first ring pattern.

2. The array substrate according to claim 1, wherein the substrate laterally protrudes toward the central axis of the through hole from the first insulating layer.

3. The array substrate according to claim 1, wherein a terminal surface of the first ring pattern is substantially coplanar with a sidewall of the substrate that defines the through hole.

4. The array substrate according to claim 1, wherein a minimum spacing between the first ring pattern and the central axis of the through hole is greater than a spacing between the central axis and the sidewall of the substrate that defines the through hole.

5. The array substrate according to claim 1, further comprising a seed layer, wherein the seed layer is disposed between the conductive structure and the substrate.

6. The array substrate according to claim 1, further comprising:
a third insulating layer, disposed on the second conductive layer, and having a third opening, wherein the third opening is communicated with the second opening; and
a third conductive layer, disposed on the third insulating layer, and comprising a third ring pattern, wherein the third ring pattern extends into the third opening from a top surface of the third insulating layer and covers a third sidewall of the third insulating layer that defines the third opening, and the conductive structure covers the third ring pattern.

7. The array substrate according to claim 6, wherein the second insulating layer laterally protrudes toward the central axis of the through hole from the third insulating layer, and the second ring pattern laterally protrudes toward the central axis from the third ring pattern.

8. The array substrate according to claim 6, wherein the second sidewall is substantially coplanar with the third sidewall, and a surface of the second ring pattern facing the second opening is substantially coplanar with a surface of the third ring pattern facing the third opening.

9. The array substrate according to claim 6, wherein the third ring pattern further extends into the second opening, and covers a surface of the second ring pattern facing the second opening.

10. The array substrate according to claim 9, wherein the third insulating layer laterally protrudes toward the central axis of the through hole from the second insulating layer.

11. The array substrate according to claim 9, wherein a surface of the third ring pattern is substantially coplanar with a surface of the first ring pattern.

* * * * *